United States Patent
Kanamaru et al.

(10) Patent No.: US 9,249,011 B2
(45) Date of Patent: Feb. 2, 2016

(54) PROCESS FOR FABRICATING MEMS DEVICE

(75) Inventors: Masatoshi Kanamaru, Tokyo (JP); Takanori Aono, Tokyo (JP); Kengo Suzuki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/378,102

(22) PCT Filed: Mar. 30, 2012

(86) PCT No.: PCT/JP2012/058659
§ 371 (c)(1),
(2), (4) Date: Aug. 12, 2014

(87) PCT Pub. No.: WO2013/145287
PCT Pub. Date: Oct. 3, 2013

(65) Prior Publication Data
US 2015/0028438 A1 Jan. 29, 2015

(51) Int. Cl.
*H01L 23/02* (2006.01)
*H01L 23/053* (2006.01)
*B81B 7/00* (2006.01)
*B81C 1/00* (2006.01)

(52) U.S. Cl.
CPC .............. *B81B 7/007* (2013.01); *B81C 1/00103* (2013.01); *B81C 1/00595* (2013.01); *B81B 2201/0235* (2013.01); *B81B 2201/0242* (2013.01); *B81B 2203/0353* (2013.01); *B81B 2203/0384* (2013.01); *B81B 2207/095* (2013.01)

(58) Field of Classification Search
None
See application file for complete search history.

(56) References Cited

U.S. PATENT DOCUMENTS

| | | |
|---|---|---|
| 6,930,055 B1 | 8/2005 | Bhowmik et al. |
| 2001/0028378 A1 | 10/2001 | Lee et al. |
| 2006/0139407 A1* | 6/2006 | Umeda et al. .................. 347/54 |
| 2009/0315646 A1 | 12/2009 | Watanabe |
| 2013/0004669 A1 | 1/2013 | Mataki |

FOREIGN PATENT DOCUMENTS

| | | | |
|---|---|---|---|
| JP | 2001-287369 A | | 10/2001 |
| JP | 2003-236797 A | | 8/2003 |
| JP | 2005-079382 A | | 3/2005 |
| JP | 2005-251898 | * | 9/2005 |
| JP | 2006-009149 A | | 1/2006 |

(Continued)

OTHER PUBLICATIONS

Machine-genrated English translation of JP 2005-251898.*

(Continued)

*Primary Examiner* — Duy T Nguyen
*Assistant Examiner* — Bo Bin Jang
(74) *Attorney, Agent, or Firm* — Mattingly & Malur, PC

(57) ABSTRACT

There are provided a process for fabricating MEMS device that includes a plurality of through-holes capable being arranged at a high density, the through-holes having a tapered end portion. Through-holes having vertical side surfaces and tapered bottoms are provided by a processing method including the steps of: disposing quadrilateral patterning having desired dimensions on a silicon substrate having a flat surface of a crystal plane, etching the substrate to a desired depth by dry etching that can realize a high aspect ratio etching, and anisotropic wet etching the dry etched substrate with a KOH aqueous solution containing isopropyl alcohol mixed thereinto.

8 Claims, 6 Drawing Sheets

(56) References Cited

FOREIGN PATENT DOCUMENTS

| JP | 2009-044031 A | 2/2009 |
|---|---|---|
| JP | 2009-059941 A | 3/2009 |
| JP | 2010-000556 A | 1/2010 |
| JP | 2010-004104 A | 1/2010 |
| JP | 2011/181829 A | 9/2011 |
| WO | 2010/044741 A1 | 4/2010 |
| WO | 2011/108750 * | 9/2011 |

OTHER PUBLICATIONS

Nilsson et al., "Fabrication of silicon molds for polymer optics", Journal of Micromechanics and Microengineering, 2003, pp. S57-S61, vol. 13.

* cited by examiner

PROCESS FOR FABRICATING MEMS DEVICE

TECHNICAL FIELD

The present invention relates to a process for fabricating MEMS device and particularly relates to a device structure for the formation of, for example, wiring structures of microdevices such as microsensors by MEMS devices and a process for fabricating the same, and a device structure for the formation of, for example, microchannel structures of microdevices by MEMS devices and a process for fabricating the same.

BACKGROUND ART

In recent years, MEMS devices, which can advantageously form microstructures having a higher aspect ratio (processing depth/opening width ratio) as compared with semiconductor devices, have become extensively applied to physical sensors such as pressure sensors and acceleration sensors, mechanisms such as micromirrors and microactuators to which electrostatic force or piezoelectric systems have been applied, and fluid devices such as nozzles for ink jetting.

In the processing and manufacture of these microstructures, semiconductor materials such as silicon are mainly applied. Processing methods include, for example, an anisotropic wet etching method in which a structure is formed by taking advantage of a difference in etching rate of silicon crystal planes, and a dry etching method to which an RIE (reactive ion etching) apparatus of an ICP (induction coupled plasma) system that can realize processing of high-aspect ratio grooves is applied. Processing of MEMS devices can realize the formation of three-dimensional structures and movable structures of silicon, is superior in processing accuracy to machining, and, thus, can be applied to various structures.

Processing by a combination of dry etching with anisotropic wet etching is described in NPL 1. In this literature, in order to remove scallops formed on the side surface of holes formed by dry etching to smooth the side surface, etching is carried out by applying a KOH aqueous solution containing isopropyl alcohol (IPA) mixed thereinto to improve surface roughness on the side surface of holes. Structures to which this method has been applied are applied to dies of molds formed of silicon structures.

In MEMS fluid devices, the arrangement of a plurality of silicon nozzles is advantageous for stirring or mixing of liquids. In order to form microstructures such as silicon nozzle structures, preferably, the end portion of through-holes has a small-hole shape. In conventional structures, a method is generally adopted in which patterning in a nozzle form is carried out on a plane for planar partial etching to form a groove and the structure is planarly applied. In recent years, however, three-dimensional structures are required as nozzles for ink jet printers. PTL 1 proposes a method for simultaneous production of through-holes. PTL 1 describes a method in which, in a dry etching method that can form vertical holes, a multi-layer mask is applied to form openings in a vertical hole form continuously at an end portion of tapered openings, thereby producing a structure including simultaneously produced through-holes. More specifically, in this structure, an inclined plane is formed from the openings, and the end portion of the holes is vertical.

Further, in the MEMS sensors and actuators, individual or a plurality of wirings are extracted from a device substrate so as to provide movable or sensing functions as various sensors and actuators. These MEMS structures are divided into device substrates in which movable portions or sensing portions have mainly been processed, and electrode substrates that function to exchange electric signals. In some cases, these structures further include cap substrates such as lids.

A method in which a wiring is extracted horizontally (transverse direction) from the device substrate, and a method in which a wiring is extracted vertically (longitudinal direction) from the device substrate are considered as a method for extracting a wiring in the MEMS structure. PTL 2 describes a method in which the wiring is extracted vertically, and a through-hole wiring structure is formed at a position away from the structure prepared in the device substrate.

CITATION LIST

Patent Literature

PTL 1: JP 2009-44031 A
PTL 2: JP 2009-59941 A

Non-Patent Literature

NPL 1: J. Micromech. Microeng. 13(2003) S57-S61

SUMMARY OF INVENTION

Technical Problem

As described in PTL 1, the method in which a small-hole nozzle structure is formed at an end portion of through-holes in MEMS fluid devices can be realized by forming a structure having an inclined plane formed from the surface of the substrate and then forming a structure having vertical holes.

In PTL 1, the shape of through-holes is in a small-hole form at the end portion. The holes, however, are in an inclined plane form from the openings, and holes having a vertical side surface and a planar bottom surface are formed at a portion around the bottom. In this structure, an inclined plane is formed from the opening, and, thus, the arrangement of through-holes at a high density is difficult. Thus, it is considered that there is a limitation on a reduction in size of the MEMS device. Further, in this joint structure, misregistration occurs, possibly leading to deterioration in properties, making it more difficult to realize a reduction in size. As compared with an inclined plane formed of a (111) crystal plane in a device structure produced by anisotropic etching of silicon, the angle is deemed to be an acute angle. However, it is considered that there is no significant difference in shape.

Regarding the preparation of the above structure, a structure is considered in which anisotropic wet etching is applied to form an inclined plane which is then combined by joining with a structure having vertical holes. To this end, a method may be adopted in which the anisotropic wet etching is carried out from a surface side with a KOH aqueous solution or the like to form a surface side, and vertical grooves are formed from a back side by dry etching, thereby forming the same shape as described above. This method experiences difficulties in performing position adjustment or continuous processing.

Further, in PTL 1, a dry etching method is applied for the processing of the inclined plane, and, thus, there is possibility that the regulation of the shape is difficult.

An electrode is advantageously extracted from a device substrate through an extraction wiring formed by disposing an electrical conductor on an insulator on through-holes formed on an electrode substrate from a device substrate with a movable portion or a sensing portion formed thereon. In particular, a structure including through-holes having a tapered end portion can be applied as a structure including a wiring extracted vertically from a MEMS device, for example, as an electrode substrate by providing an electric wiring thereon, and, thus, can be advantageous for the preparation of microstructures.

The structure including an electrode vertically extracted from a device substrate can realize a reduction in dimension, because an electrode pad can be disposed on a MEMS device. In this structure, the number of chips extractable from one sheet of a silicon substrate can be increased, leading to a benefit in cost.

Two methods are considered for the extraction of electrodes vertically from a device substrate: a method that includes forming an inclined plane of a (111) crystal plane to which anisotropic wet etching of silicon has been applied, and forming a wiring along the inclined plane; and a method that includes forming vertical holes by a dry etching method and filling the holes with poly-silicon (polysilicon) doped with phosphorus or the like to form a wiring.

In the anisotropic wet etching of silicon, the dimension of an opening formed on the surface of a MEMS device is about 1.4 times larger than the thickness of the electrode substrate. Accordingly, an electrode pad that performs electrical exchange with the outside should be formed in a portion other than the opening, and, thus, the area of the electrode pad is large.

In the structure of through-holes formed by the dry etching method, the limit of the aspect ratio is about 20, and the diameter of the hole necessarily increases with an increase in thickness of the substrate. Further, there is a limitation in filling all the holes, leading to a possibility that the application of a thick substrate is difficult and the processing is complicated. When the electrode substrate is thin, there is a possibility that, in a package stage that is finally carried out, the device is deformed by a resin molding pressure, resulting in deteriorated properties.

In the electrode substrate, the structure that can allow the size of an electrical contact with a device substrate to be reduced can realize the formation of a movable portion or a sensing portion having a large area, contributing to a reduction in size of the device.

PTL 2 describes a structure in which a through-wiring is vertically extracted. Since, however, the through-wiring is disposed at a position outside the device structure, it is considered that there is a limitation on a reduction in size of a chip.

Further, even when a wiring structure is formed in the structure of PTL 1, since an inclined plane is expanded from the opening, it is expected that there is a limitation on a reduction in size of the MEMS device.

Accordingly, an object of the present invention is to provide a structure of a MEMS device having a device structure that can realize, for example, a wiring structure suitable for a reduction in size of the MEMS device and a nozzle structure and the like, and a process for fabricating the same.

Solution to Problem

The present invention provides a process for fabricating MEMS device having vertical holes that have a side surface substantially vertically extended from an opening and have an end portion which has an inclined plane form and is tapered, particularly having through-holes.

For example, according to the present invention, a through-hole structure including vertical holes having a vertical side surface and holes that have a tapered end portion and are in communication with the vertical holes can be provided by a processing method for through-hole formation, including the steps of: disposing a quadrilateral mask pattern having a desired dimension on a silicon substrate having a flat surface of a (100) crystal plane; performing dry etching of a quadrilateral pattern at a high aspect ratio through the mask to a desired depth; and performing wet etching with an alkaline etchant such as a KOH aqueous solution or a tetramethylammonium hydroxide solution (TMAH), the solution containing isopropyl alcohol mixed thereinto.

In the vertical holes according to the present invention, the vertical side surface is a (110) plane, and the crystal plane of the inclined plane at the end portion is a (111) crystal plane. Accordingly, the angle at the end portion of the through-holes that makes with the flat portion is about 54.7 degrees. The vertical side surface of the vertical holes is vertical but may be substantially vertical. The vertical side surface is formed by taking advantage of such properties that the (110) plane of silicon is formed as vertical side surface by anisotropic etching. Alternatively, other etching methods may be adopted as long as substantially vertical holes can be formed. Further, the vertical holes according to the present invention may not be through-holes but non-through-holes.

The arrangement of through-holes at a high density can realize a nozzle structure having excellent shape accuracy and thus can be applied to MEMS nozzles or MEMS fluid devices.

Further, a construction obtained by forming an insulating film such as an oxide film in the through-holes and forming an electric wiring formed of a conductive material thereon can be applied as an electrode substrate for MEMS devices. In the present invention, through-holes are formed substantially vertically from openings, and the end portion can be formed in a small size. Therefore, the size of an electric contact with the device structure or the sensing structure can be reduced, contributing to a size reduction.

In the MEMS device according to the present invention, the tapered end portion of the through-holes has a small area and thus can easily be sealed with a solder material, and the end portion can be sealed while regulating the pressure within the device substrate.

Since a portion around a tapered portion of the through-holes has a small area, a method other than the solder sealing may be adopted. For example, a method may be adopted in which the portion around the tapered portion may be formed of a joint material of an alloy layer composed of gold and tin.

In a structure including two sheets of electrode substrates stacked on top of each other, wherein openings are joined to each other for electrical and structural connection, a small size of contact with the device substrate and a small dimension of an electrode pad on the surface of the electrode substrate can be realized. The adoption of a multi-layer structure can realize the formation of a thick electrode substrate and can satisfactorily withstand a pressure applied in the formation of a resin package, and problem of deformation and the like does not occur.

Thus, the MEMS device according to the present invention has a structure including: a semiconductor substrate having a first surface and a second surface; and vertical holes that are holes formed from the first surface into the semiconductor substrate, wherein the holes have a side surface extended from an opening of the first surface and being a substantially vertical surface and have a diameter that is reduced in their portions inside the holes while forming an inclined plane, particularly the vertical holes are through-holes that extend from the first surface to the second surface.

Further, the process for fabricating a MEMS device according to the present invention is a process for fabricating a MEMS device that can allow a device structure having vertical holes, particularly through-holes to be accurately prepared on a semiconductor substrate by a vertical hole production process, the process including steps of: disposing a mask pattern on a semiconductor substrate; dry-etching the semiconductor substrate through the mask to a desired depth to form vertical holes having a substantially vertical side surface; and anisotropic wet etching the vertical holes to form tapered continuous holes surrounded by inclined planes at a portion near the bottom of the vertical holes.

Advantageous Effects of Invention

According to the present invention, since, in a MEMS device structure, a structure including through-holes having a tapered end portion can be formed, for example, micronozzles of MEMS fluid devices can be constructed and, further, a wiring structure can be formed in the tapered through-holes. Thus, for example, MEMS sensors and actuators having a micro-wiring structure can be constructed.

Further, according to the production process, tapered holes surrounded by inclined planes can be prepared at the bottom of the vertical holes in communication with each other by performing dry etching from a major surface of the semiconductor substrate and subsequently performing anisotropic wet etching.

Thus, the present invention can provide a process for fabricating MEMS device that can easily realize a reduction in size.

DESCRIPTION OF EMBODIMENTS

Embodiments of the present invention will be described in connection with the accompanying drawings. However, it should be noted that the following embodiments are typical examples for illustrating the present invention and should not be construed as limiting the constitution of the present invention.

Figure 1:
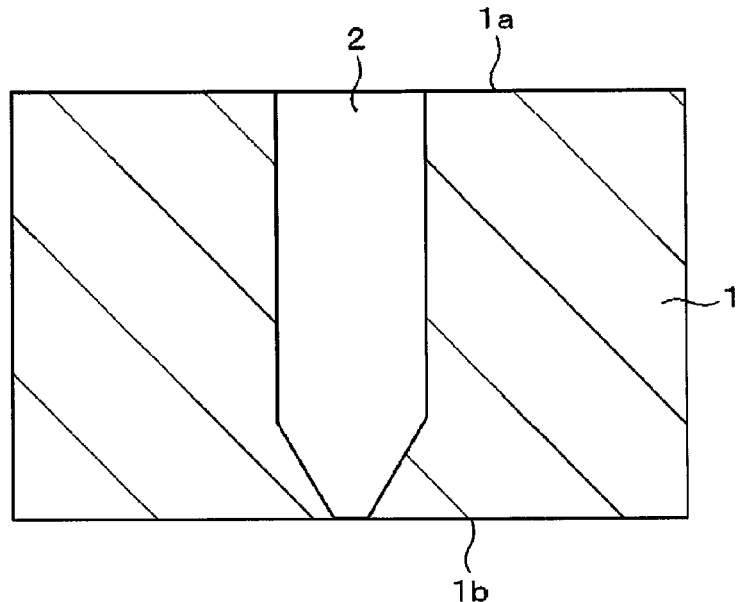
FIG. 1 is a cross-sectional view illustrating the shape of a through-hole in an embodiment of the present invention.
Figure 2:
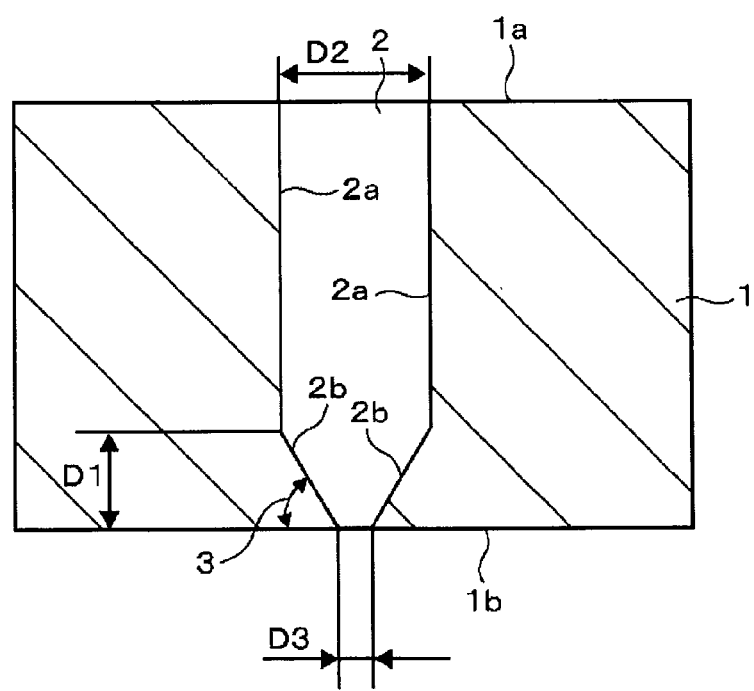
FIG. 2 is a detailed cross-sectional view illustrating the shape of a through-hole in an embodiment of the present invention.

The shape of through-holes in an embodiment of the present invention will be described in conjunction with FIGS. 1 and 2. As can be seen from FIG. 1, a through-hole 2 formed in a silicon substrate 1 has such a shape that the hole extends from a surface side 1a of the silicon substrate 1, is connected to a bottom side while maintaining a vertical shape, and is tapered on a back surface side 1b of the silicon substrate 1. In the present invention, the end portion of the through-hole is tapered. However, the opening width of the most leading portion may be freely regulated depending upon contemplated applications.

Next, crystal orientation will be described in conjunction with FIG. 2. Flat portions 1a and 1b in a silicon substrate are of a (100) crystal plane, a vertical side surface 2a of a through-hole is of a (110) crystal orientation, and an inclined plane 2b is of a (111) crystal orientation. For this reason, an angle 3 between the end portion of the through-hole and the flat portion of the silicon substrate is about 54.7 degrees. In the through-hole according to the present invention, the vertical side surface is surrounded by a (110) crystal plane, and the inclined plane of the through-hole is surrounded by a (111) crystal plane. Thus, the opening has a width D2 defined by the following equation 1. In other words, regarding the shape of the through-hole according to the present invention, the following relationship is established.

$$D2=(D1\times\sqrt{2})+D3 \qquad \text{(Equation 1)}$$

Next, a production process of the through-hole will be described in conjunction with FIGS. 3(a) to 3(e). At the outset, a silicon substrate 1 is prepared [FIG. 3(a)]. A thermal oxide film 4 is formed on both surfaces of the silicon substrate [FIG. 3(b)]. The oxide film is then subjected to a photolithographic process, that is, is subjected to coating of a resist, development, and exposure to remove the thermal oxide film only in its portion of a portion of an opening 5 in a through-hole [FIG. 3(c)]. The opening 5 is preferably quadrilateral. When the opening 5 is in other forms, various crystal planes appear on the side surface, leading to a lack of stability. In this embodiment, an opening pattern of a quadrilateral shape having one side length of 50 μm.

Figure 3:
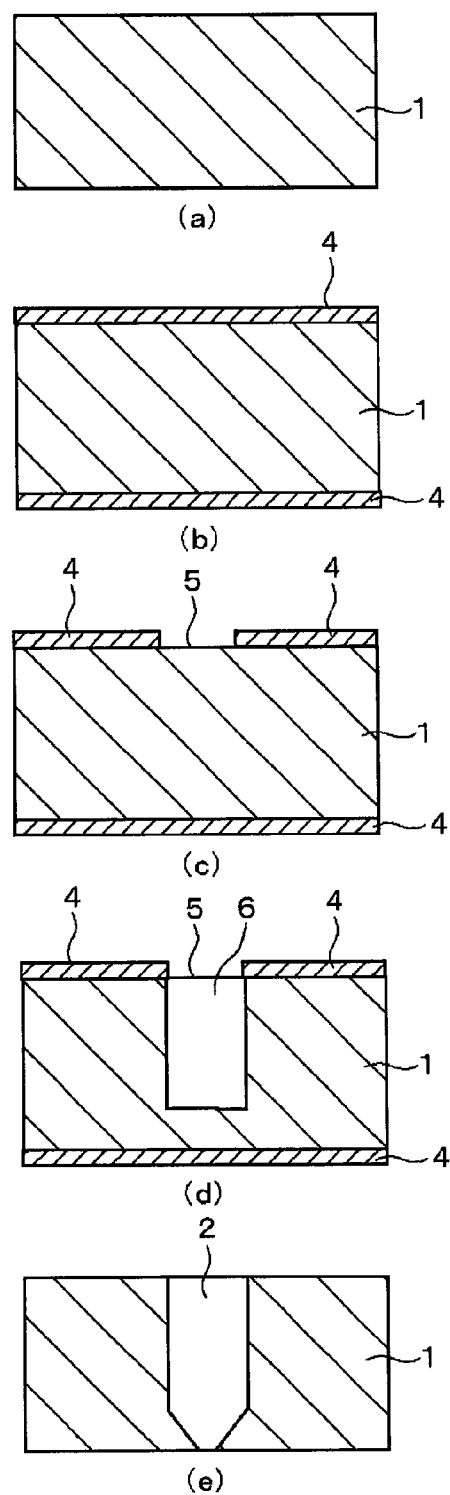
FIGS. 3(a) to 3(e) are process diagrams illustrating the shape of a through-hole in an embodiment of the present invention.

Next, a vertical groove 6 is formed by applying a dry etching method to which an ICP-type RIE apparatus that can form grooves having a high aspect ratio by processing is applied [FIG. 3(d)]. The drying etching method is preferably a Bosch process disclosed in NPL 1. This Bosch process is a method in which dry etching with gas such as sulfur fluoride-based SF6 and passivation with gas such as fluorocarbon-based CHF3 or C4F8 are alternately repeated for anisotropic etching method. In this example, dry etching was carried out by a dry etching process with SF6 gas under conditions of a pressure of 3 Pa, a flow rate of 300 sccm and a time of 7 seconds, passivation was carried out by a passivation process with C4F8 gas under a pressure of 1.4 Pa and a flow rate of 200 seem, and a time of 4 seconds, and both processes were alternately carried out for 56 min. The substrate temperature was held at 20° C., and the main output and the bias output in the dry etching process were 1000 W and 80 W, respectively. The gas species used in the dry etching is not limited to the above example.

Finally, anisotropic wet etching is carried out with a KOH aqueous solution containing isopropyl alcohol (IPA) mixed thereinto to a supersaturated state. IPA was mixed into a 40 wt % KOH aqueous solution to a supersaturated state, and anisotropic wet etching was carried out at 67° C. The reason why IPA was brought to a supersaturated state is to complement a reduction in the amount of IPA by evaporation. In this anisotropic wet etching, an inclined plane is formed by anisotropic etching at the bottom of the hole formed by dry etching to form a through-hole 2 according to the present invention [FIG. 3(e)].

In an embodiment of the present invention, after dry etching, wet etching is carried out with a KOH aqueous solution containing isopropyl alcohol added thereto. This wet etching utilizes such a property that the etching rate of the (110) crystal plane is slower than that of the (100) crystal plane.

The steps illustrated in FIGS. 7(a) to 7(d) are the same as those illustrated in FIGS. 3(a) to 3(d). In general, as illustrated in FIGS. 7(a) to 7(e), when a KOH aqueous solution free from isopropyl alcohol is used, as illustrated in FIG. 7(e), the whole inner surface of the through-hole is covered with the (111) crystal plane, resulting in the formation of a structure in which the side surface of the through-hole is recessed.

Figure 4:
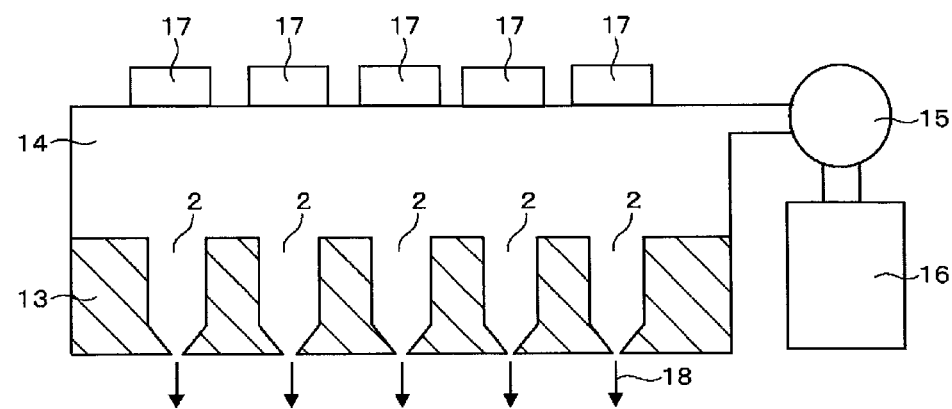
FIG. 4 is a cross-sectional view illustrating a MEMS nozzle device in an embodiment of the present invention.

In the present invention, a micronozzle device can be produced. FIG. 4 is a cross-sectional view illustrating a MEMS nozzle device in an embodiment of the present invention. FIG. 4 illustrates an example of an ink jet printer for industrial use that ejects ink. Ink supplied from an ink tank 16 through a pump 15 is supplied into an ink tank 14. The ink, when vibrated with a piezoelectric element 17, is passed through a through-hole 2 having a shape according to the present invention disposed within a nozzle device 13 and is ejected through the nozzle device 13 to an ink ejection direction 18. The nozzle device according to the present invention can be applied to industrial applications, as well as to household applications.

More specifically, a continuous ink jet method in which continuously formed liquid droplets, in use, are deflected is used in ink jet printers for industrial applications. Quick drying solvent-based inks can be applied to marking in a matter to be printed. Marking of any desired ink can be performed by combining a charged electrode and a deflection electrode with a construction illustrated in FIG. 4.

In the nozzle device in an embodiment of the present invention, the shape of the through-hole 2 is formed on an etched surface and can be prepared finely with high accuracy, and, thus, the shape of ejected ink can also be rendered uniform.

FIG. 4 is a cross-sectional view illustrating a MEMS nozzle device. For some applications, a three-dimensional arrangement is possible. Further, through-holes are produced by applying a MEMS technique and thus can be arranged at a high density.

Further, the through-hole structure according to the present invention can be applied to mixing, stirring and the like in MEMS fluid devices.

In the present invention, a method can be adopted in which an insulator such as an oxide film is formed in through-holes formed in a silicon substrate and an electrically conductive wiring can be formed on the insulator. Thus, the present invention can be applied to wiring structures of MEMS devices.

Figure 5:
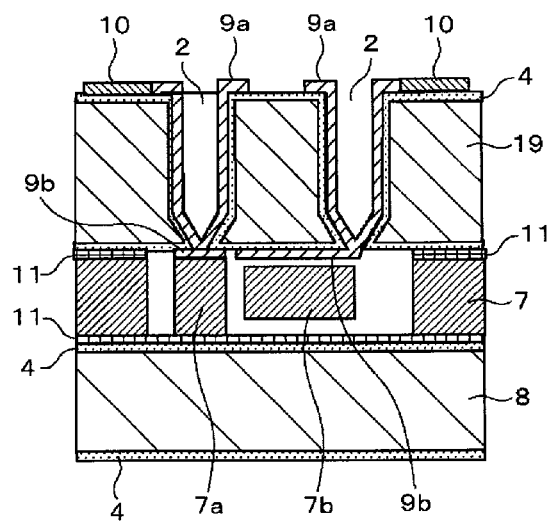
FIG. 5 is a cross-sectional view illustrating a MEMS device in an embodiment of the present invention.

FIG. 5 is a view illustrating one example of a sensor device as a MEMS device in an embodiment of the present invention. The sensor device can include a device substrate 7 with a drive or a sensing portion formed thereon, an electrode substrate 19 for an electrical exchange provided on the top of the device substrate 7, and a cap substrate 8 provided under the device substrate 7.

A through-hole 2 according to the present invention is formed in the electrode substrate 19, and a metallic wiring 9a is continuously connected to an electrode pad 10 in a desired pattern through a thermal oxide film 4. Further, a desired metallic wiring pattern 9b is formed on a back surface side of the electrode substrate 19. The device substrate 7 is joined to an electrode substrate 19 and a cap substrate 8 through a junction layer 11, and the inside of the device substrate has been sealed by vacuum or atmospheric sealing.

For example, a structure 7a of the device substrate is a structure of fixed comb and the like in a comb sensor, a metallic wiring 9a is electrically connected thereto, and the metallic wiring 9a is connected to the electrode pad 10. A structure 7b in the device substrate is a structure of a movable comb and the like in a comb sensor, floats in the air, and is movable. This structure is driven when a rate of acceleration or an angular rate is applied, thereby grasping a change in capacity with the metallic wiring. Further, driving by applying an electrostatic force is also possible.

The end portion of the through-hole according to the present invention has a tapered inclined plane structure. The metallic wiring can easily be prepared, for example, by a sputtering apparatus or a vapor deposition apparatus. The metallic wiring may also be formed, for example, by a CVD (Chemical Vapor Deposition) apparatus. According to this construction, the wiring can be formed along the shape without forming a large-thickness layer.

Regarding the metallic wiring material, a method may be adopted in which chromium or titanium is disposed as a substrate layer by taking into consideration the adhesion and gold is deposed on the substrate layer. Further, platinum or nickel may be disposed between chromium or titanium and gold from the viewpoint of improving the heat resistance. The wiring material is not limited to the above materials, and wiring materials such as aluminum and doped silicon may also be applied.

Since the inside of the device substrate is sealed by vacuum or atmospheric sealing, sealing of the device substrate can be performed by inserting a solder ball into the end portion of the through-hole and melting the ball. Further, sealing can be performed by using such a structure that continuity is carried out by junction.

Substrates may be joined to each other by eutectic bonding that is carried out by applying a eutectic crystal between gold and silicon and between gold and tin.

A silicon substrate having a low resistance is preferably applied to the device substrate, and silicon materials per se can be applied as the electrode material. Further, a cap substrate or an SOI (silicon on insulator) substrate to which the electrode substrate has been joined from the beginning can also be applied. For example, when an SOI substrate with the electrode substrate joined thereto is used, etching can be stopped by an insulating film (for example, SiO2) in forming through-holes from the surface of the electrode substrate towards the device substrate.

In the structure illustrated in FIG. 5, the size of electric contact with a structure 7a of the device substrate is small, and the size of an electrode pad disposed in the electrode substrate can be reduced because of vertical extraction. Therefore, the dimension of the whole device can be reduced, and, further, the number of elements extracted from one wafer is increased, leading to a lowered cost.

In the electrode substrate, a method may be adopted in which etching is performed while leaving a portion around the through-hole of the electrode substrate to form a structure in which only the portion around the through-hole is in a protruded state. In this structure, the gap formed with the device substrate can easily be provided, and, according to this construction, a gap against the sensor can be provided. A difference in structure between the present invention and the conventional examples will be described.

Figure 8:
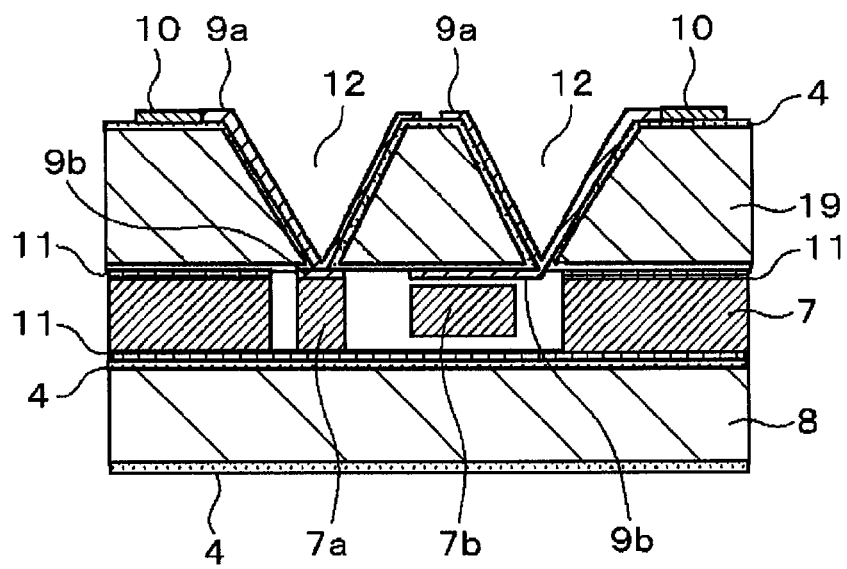
FIG. 8 is a cross-sectional view illustrating a device structure formed by a conventional anisotropic wet etching method.

Next, the extraction of conventional wiring to which anisotropic wet etching of silicon has been applied will be described in conjunction with FIG. 8. The structure of a device substrate 7 and a cap substrate 8 in FIG. 8 is the same as the structure illustrated in FIG. 5. In the electrode substrate 19, a silicon anisotropic etched hole of an inclined plane is formed by anisotropic wet etching of silicon. In this structure, an inclined plane expands from the opening, and the metallic wiring can be formed by a sputtering apparatus or a vapor deposition apparatus. The width of the opening in the silicon anisotropic etched hole is about 1.4 times the thickness of the electrode substrate from a relationship with crystal orientation and thus is large. When the area of the electrode pad is also included, the dimension of the electrode substrate should be further increased and, consequently, a reduction in size is difficult in the electrode extracted structure using the silicon anisotropic etched hole.

Figure 9:
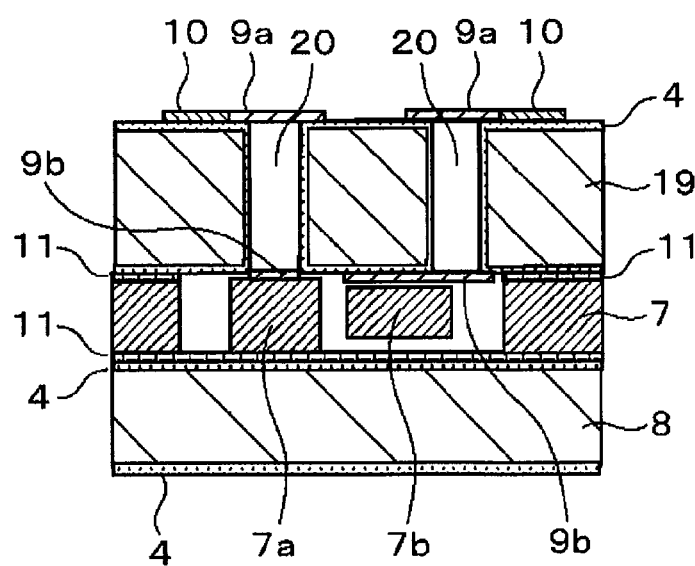
FIG. 9 is a cross-sectional view illustrating a device structure formed by a conventional dry etching method.

A prior art in which dry etching of silicon has been applied to the extraction of electric signals from the device substrate will be illustrated in FIG. 9. The structure of a device substrate 7 and a cap substrate 8 in FIG. 9 is the same as the structure illustrated in FIG. 5. A structure in which the inside of a vertical dry etched hole formed in the electrode substrate 19 is filled with a conductor 20 is generally adopted. This is because breaking occurs at a corner portion in the bottom of the hole even when the formation of a metallic wiring in a groove having a high aspect ratio is contemplated. That is, since the corner portion at the inlet of the hole blocks the inflow of ions in sputtering, the formation of the metallic material on the side surface near the bottom of the hole is difficult due to an influence of a solid angle.

Even when the pressure within the device substrate is regulated to a desired pressure, since the dry etched hole has a large diameter, sealing only with the wiring material is difficult. For this reason, in many cases, the hole formed by the dry etching is generally filled with a conductor.

In the dry etched hole, the thick electrode substrate cannot be formed due to a relationship with the aspect ratio. Even when a dry etching method that can realize high-aspect ratio processing is applied, the aspect ratio that can be achieved by the processing is said to be about 20. That is, even when the diameter of the hole formed in the electrode substrate is 10 μm, the limit of the thickness of the electrode substrate is 200 μm.

On the other hand, in the MEMS device, in order to regulate the sensor structure, a method is adopted in which LSI for regulation is connected thereto by wire bonding and, finally, packaging is performed with a resin or the like to form a commercial product. In this case, it is considered, when the thickness of the electrode substrate is small, after packaging, the sensor causes malfunction due to the deformation of the resin caused by an influence of an external atmosphere.

In the present invention, since the formation of the hole by dry etching is followed by anisotropic wet etching, the thickness of the electrode substrate can be increased. Further, as illustrated in FIG. 6, the thickness of the electrode substrate can be increased by superimposing a plurality of electrode substrates according to the present invention.

Figure 6:
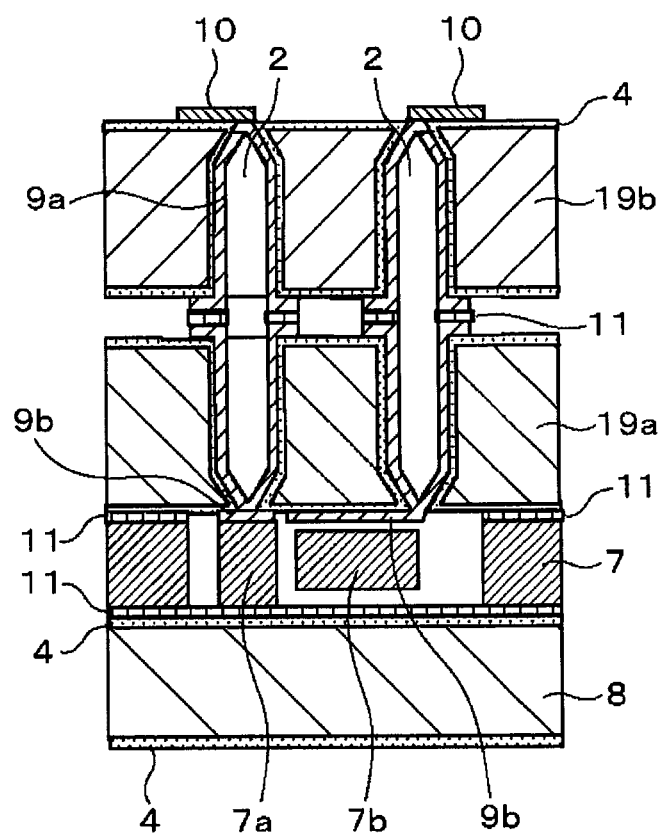
FIG. 6 is a cross-sectional view illustrating another MEMS nozzle device in an embodiment of the present invention.
Figure 7:
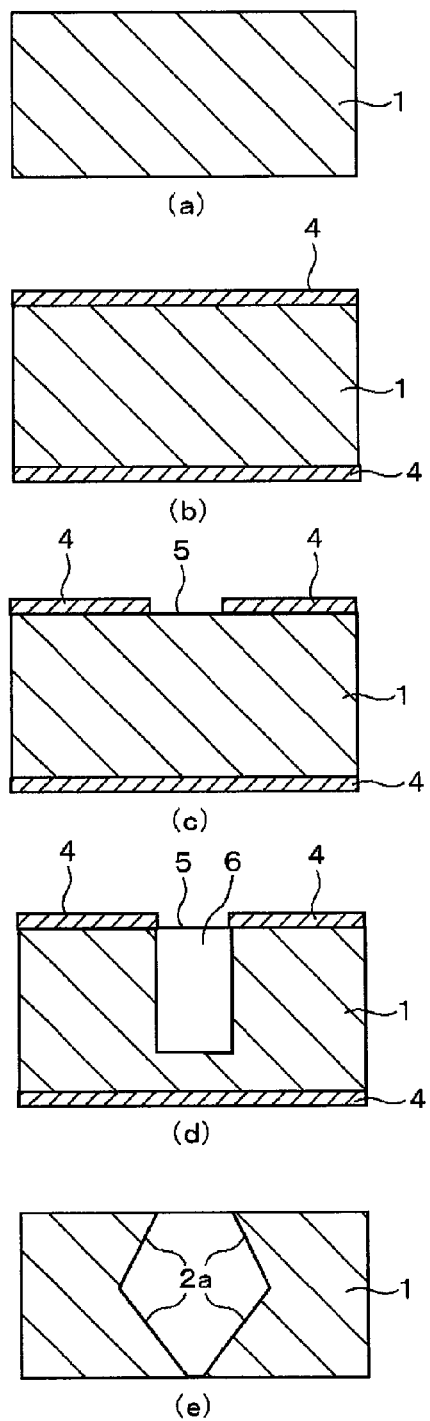
FIGS. 7(a) to 7(e) are process diagrams illustrating conventional through-hole shapes.

FIG. 6 is a cross-sectional view illustrating a device structure in a MEMS device in another embodiment of the present invention. In the embodiment illustrated in FIG. 6, the device structure is a structure in which through-holes 2 in electrode substrates 19a and 19b are arranged in a vertically reversed state.

Regarding electric extraction in FIG. 6, a structure 7a in a device substrate 7 is in contact with a metallic wiring 9b disposed on a back surface side of an electrode substrate 19a and is connected to a metallic wiring 9a formed in the through-hole in an electrode substrate 19b through a metallic wiring formed on the side surface of the electrode substrate 19a. The electrode substrates 9a and 9b are electrically conducted by a junction layer 11, and, consequently, electrical connection from the device substrate 7 to an electrode pad 10 formed on the surface of the electrode substrate 19b is possible.

Further, in the outlet of the metallic wiring in the electrode substrate 9b, the area of the electrode pad is small, and a reduction in size of the whole sensor device can be realized. Further, a structure that can allow the thickness of the electrode substrate to be formed in a large thickness can be provided. Thus, even in resin molding, the device portion can be protected against an external force, and highly reliable devices can be provided.

Thus, in the device structure in the embodiment illustrated in FIG. 6, a large-thick electrode substrate can be constructed to attain the effect of enhancing the strength of the MEMS device.

In the present invention, besides a combination of symmetric electrode substrates, the preparation of a desired wiring structure on a back surface side of the electrode substrate 19b can allow an electrode pad to be extracted at a desired position by routing of a wiring.

The device structure according to the present invention described in the above embodiments can be applied to various MEMS devices, specifically fluid devices and sensor devices, as well as MEMS devices that require electrical exchange, such as pressure sensors and micromirrors.

Although embodiments according to the present invention have been described, it could easily be understood by a person having ordinary skill in the art that the present invention is not limited to the above embodiments, and various modifications are possible within the scope of the present invention described in the claims.

REFERENCE SIGNS LIST

1 . . . silicon substrate
2 . . . through-hole of present invention
3 . . . angle at end portion of through-hole
4 . . . thermal oxide film
5 . . . opening
6 . . . dry etched groove
7 . . . device substrate
8 . . . cap substrate
9, 9a, 9b . . . metallic wiring
10 . . . electrode pad
11 . . . junction layer
12 . . . silicon anisotropic etched hole
13 . . . nozzle device
14 . . . ink tank
15 . . . pump
16 . . . ink tank
17 . . . piezoelectric element
18 . . . ink ejection direction
19, 19a, 19b . . . electrode substrate
20 . . . conductor

The invention claimed is:
1. A MEMS device having a structure comprising:
a first sheet of a semiconductor substrate having a first surface and a second surface;
first vertical holes extending from the first surface through the first semiconductor substrate to the second surface, wherein:
the first vertical holes have a side surface extending from a first opening in the first surface and being a substantially vertical surface, continuously forming an inclined plane from the vertical surface inside the first vertical holes while a diameter is reduced, and being open at a second opening in the second surface with the inclined plane; and
the second opening is smaller than the first opening;
first electrical conductors extending inside the holes from the first opening to the second opening;
a second sheet of a semiconductor substrate having a third surface and a fourth surface, the second sheet overlying the first sheet, such that the third surface is adjacent to the first surface;
second vertical holes extending from the third surface through the second semiconductor substrate to the fourth surface, opposite to the first surface, wherein:
the second vertical holes have a side surface extending from a third opening in the third surface and being a substantially vertical surface, continuously forming an inclined plane from the vertical surface inside the second vertical holes while a diameter is reduced, and being open at a fourth opening in the fourth surface with the inclined plane; and
the fourth opening is smaller than the third opening;
second electrical conductors extending inside the second vertical holes from the third opening to the fourth opening;
a device substrate electrically connected to the second openings at the second surface;
an electrode pad formed on the fourth surface; and
a junction layer connecting the first electrical conductors and the second electrical conductors, such that the device substrate is electrically connected to the electrode pad via the first electrical conductors, the junction layer, and the second electrical conductors.

2. The MEMS device according to claim 1, further comprising an insulating film formed in the first vertical holes and the second vertical.

3. The MEMS device according to claim 1, wherein the device substrate comprises a sensor connected to the first electrical conductors, wherein at least one of the first electrical conductors is joined to an electrode in the device substrate, and signals from the sensor in the device substrate are conducted to the electrode pad via the at least one first electrical conductor, and at least one of the second electrical conductors connected to the at least one first electrical conductor via the junction layer.

4. The MEMS device according to claim 1, wherein at least one of the first vertical holes has a solder-sealed bottom.

5. The MEMS device according to claim 1, wherein:
another junction layer is formed between the device substrate and the second surface; and
the junction layer and/or the other junction layer includes a junction material of a gold-tin alloy layer.

6. The MEMS device according to claim 1, wherein at least one of the first semiconductor substrate or the second semiconductor substrate is a silicon substrate having a first surface of a plane, the vertical surface is of a plane, and the inclined plane is of a plane.

7. A MEMS device having a structure comprising:
a first sheet of a semiconductor substrate having a first surface and a second surface;
first through-holes in the first semiconductor substrate extending through the first semiconductor substrate from the first surface to the second surface, wherein:
the first through-holes have a side surface extending from a first opening in the first surface and being a substantially vertical surface, continuously forming an inclined plane from the vertical surface near a bottom while a cross section is reduced, and being open at a second opening in the second surface with the inclined plane, and
an angle between the inclined plane of the second opening and the second surface being 54.7 degrees such that the second opening is smaller than the first opening;
first electrical conductors extending inside the holes from the first opening to the second opening;
a second sheet of a semiconductor substrate having a third surface and a fourth surface, the second sheet overlying the first sheet, such that the third surface is adjacent to the first surface;
second through-holes in the second semiconductor substrate extending through the first semiconductor substrate from the third surface to the fourth surface, wherein:
the second through-holes have a side surface extending from a third opening in the third surface and being a substantially vertical surface, continuously forming an inclined plane from the vertical surface near a top while a cross section is reduced, and being open at a fourth opening in the fourth surface with the inclined plane, and
an angle between the inclined plane of the fourth opening and the fourth surface being 54.7 degrees such that the fourth opening is smaller than the third opening;
second electrical conductors extending inside the second through-holes from the third opening to the fourth opening;
a device substrate electrically connected to the second openings at the second surface;
an electrode pad formed on the fourth surface; and
a junction layer connecting the first electrical conductors and the second electrical conductors, such that the device substrate is electrically connected to the electrode pad via the first electrical conductors, the junction layer, and the second electrical conductors.

8. The MEMS device according to claim 7, wherein at least one of the first semiconductor substrate or the second semiconductor substrate is a silicon substrate having a first surface of a plane, the vertical surface is of a plane, and the inclined plane at a portion near the bottom is of a plane.

* * * * *